United States Patent [19]

Bailey

[11] 4,170,471

[45] Oct. 9, 1979

[54] SILVER ALLOYS FOR METALLIZATION OF MAGNETIC BUBBLE DOMAIN DEVICES

[75] Inventor: Robert F. Bailey, Los Alamitos, Calif.

[73] Assignee: Rockwell International Corporation, El Segundo, Calif.

[21] Appl. No.: 928,488

[22] Filed: Jul. 27, 1978

[51] Int. Cl.² ............................................... C22C 5/00
[52] U.S. Cl. ............................... 75/173 C; 75/173 R; 357/65
[58] Field of Search ........................ 75/173 R, 173 C; 357/65

[56] References Cited

U.S. PATENT DOCUMENTS

| | | | |
|---|---|---|---|
| 2,272,063 | 2/1942 | Hensel et al. | 200/166 |
| 2,353,254 | 7/1944 | McCandless | 220/89 |
| 3,082,521 | 3/1963 | Cohen | 29/497 |
| 3,669,655 | 6/1972 | Cox | 75/173 R |
| 3,874,941 | 4/1975 | Shibata | 75/173 R |

FOREIGN PATENT DOCUMENTS

| | | | |
|---|---|---|---|
| 1191585 | 4/1965 | Fed. Rep. of Germany | 75/173 R |
| 1758327 | 9/1971 | Fed. Rep. of Germany | 75/173 R |
| 39-22496 | 10/1964 | Japan | 75/173 R |
| 47-49674 | 12/1972 | Japan | 75/173 R |

OTHER PUBLICATIONS

D'Heurle, "The Thin Film Stripes. . ." IBM-TDB, 14, 1971, 596.

Prokop et al., "Electromigration. . .Al-Si Contacts" J. Appl. Phys. 43 1972, 2595.

Primary Examiner—L. Dewayne Rutledge
Assistant Examiner—Upendra Roy
Attorney, Agent, or Firm—H. Fredrick Hamann; G. Donald Weber, Jr.

[57] ABSTRACT

There is described a metal alloy which provides improved operating characteristics and parameters for, inter alia, magnetic bubble domain devices.

2 Claims, No Drawings

SILVER ALLOYS FOR METALLIZATION OF MAGNETIC BUBBLE DOMAIN DEVICES

The invention herein described was made in the course of or under a contract or subcontract thereunder, with the Air Force.

BACKGROUND OF THE INVENTION

1. Field of the Invention

This invention is directed to a metal alloy, in general, and to an alloy especially useful in magnetic bubble domain devices to establish improved operating characteristics through improved metallization technology, in particular.

2. Prior Art

Magnetic bubble domain devices are a relatively well known technology at this time. Magnetic bubble domain device technology is, of course, the subject of continuous experimentation to seek advantageous improvements in terms of individual devices, systems and processing techniques. In the past, magnetic bubble domain devices have been formed using, as the manipulating devices, permalloy patterns or structures. The permalloy patterns have been combined with aluminum or doped aluminum utilization layers which are used as conductors to control magnetic bubble domain manipulation or the like. The properties of the aluminum or doped aluminum conductors are well known in the industry. Other metals and alloys have been investigated and/or considered but rejected for one or more reasons. For example, gold has been rejected as being too expensive. The best material, in terms of conductivity, is silver. However, historically, silver has been rejected as having poor adhesion to most surfaces, low corrosion resistance. Historically, silver has been unacceptable to the semiconductor microelectronic industry as a viable conductor material for the above reasons. In addition, silver is also noted to be subject to high ionic migration drift rates in dielectric oxides in the presence of moderately low electric fields.

In view of the difficulties noted above, silver had, therefore, been discarded as a suitable conductor material or metal for use in magnetic bubble domain devices. However, it is still desirable to obtain the high conductivity property thereof provided that a suitable arrangement can be made to cope with the shortcomings noted.

PRIOR ART

There is no known prior art directed to the specific invention shown and described herein. The prior art does recognize magnetic bubble domain devices using permalloy manipulation patterns and aluminum or doped aluminum conductors.

SUMMARY OF THE INVENTION

In this invention there is provided a high conductivity, low electromigration-rate metal alloy which is specifically suitable for magnetic bubble domain devices. In particular, the metal alloy comprises silver as the host metal with moderate percentages of certain foreign metals such as but not limited to indium, lead, tin, copper, palladium, beryllium, and manganese. By using 1 to 6 percent (atomic) of the dopant, the high conductivity of the silver is retained while certain of the shortcomings of silver as a conductor element, per se, are reduced.

DESCRIPTION OF THE PREFERRED EMBODIMENT

As discussed supra, there is described an alloy of silver which can be used in forming magnetic bubble domain devices and device structures, in particular, the conductor used in magnetic bubble domain devices. The silver alloy comprises silver as the base or host material. Dopants in moderate percentages, for example on the order of 1 to 6 percent (atomic) of a material such as indium, lead, tin, copper, palladium, beryllium, and manganese can be used to form a silver alloy which possesses a low electromigration rate while at the same time possessing the desired high conductivity characteristics. In point of fact, the electrical conductivity of silver doped with approximately 3% (at.) indium has been found to be approximately 1.5 to 2.5 times greater than the conductivity of the standard metallization currently used on magnetic bubble domain devices which is, typically, aluminum or aluminum doped with copper.

It has also been found that the doped silver has a relatively low electrical resistivity and a relatively high resistance to electromigration. This latter characteristic has been determined largely using a mathematical model for electromigration phenomena as described herein.

Electromigration is essentially due to the movement of the conductor material atomic specie in the intergranular or non-crystalline areas which exist between the crystal grains or crystallites in a thin film material. The movement of the "host" atoms is caused by electric currents. Electromigration processes in polycrystalline thin films at moderate (e.g. room temperature to 200° C.) temperatures damage the metallization patterns when localized changes occur in mass flow. These changes cause localized mass depletion (leading to holes) or localized mass accumulations (leading to hillocks or whiskers). This movement of host conductor material occurs due to a momentum transfer between the electrons and the atoms. Normally, local electrostatic fields oppose any atomic motion due to the momentum transfer. Vacancy generation mechanisms and vacancy distributions play a large part in the movement of the metal atoms since atomic movement or drift (or enhanced diffusion) can only occur in conjunction with an atomic vacancy site.

It appears then, that there are several ways to minimize the mass transport of conductor material in order to extend the life of the conductor line before the electromigration phenomena causes an "open" in the conductor line.

1. The more massive the conductor atom, the lower will be the electromigration rate because more momentum will be required to cause it to move. Hence the conductor material should preferably include a "heavy" atom.

2. The higher the conductivity of the host material, the lower will the incidence of interaction, or scattering, or momentum transfer, events per transported electron. Hence, the conductor should preferably be a low resistivity material.

3. Since electromigration is most prevalent in the intergranular region, where vacancy densities are highest, it is logical to look for a way in which to reduce the mobility of these vacancies. One such possibility is to place a small amount of impurity atoms in these regions that will achieve this result.

In order to further consider these factors, a mathematical model of the electromigration mechanism is developed. It is convenient to write the net force ($\hat{F}$) seen by an atom in terms of the effective charge on the metallic ion, q*:

$$\hat{F} = q^* \hat{E} \qquad (1)$$

where q* is nq, the effective electronic charge on the metallic ion (wherein n is an integer and q is the electronic charge) and $\hat{E}$ is the electric field.

The force, or momentum impulse applied by moving electrons is usually larger than the electrostatic attraction which opposes the force and, hence, the result is a slight atom drift velocity in the direction of electron flow. According to Einstein's relationship, the atom flow, $\hat{Q}$ should be:

$$\hat{Q} = (ND/kT) q^* \hat{E} = (ND_o/kT) q^* \hat{E} \exp(-E_A/kT). \qquad (2)$$

where
N is the density of conductor atoms
D is the self diffusion coefficient
$E_A$ is the activation energy of diffusion
k is Boltzmann's constant
T is the absolute temperature in the vicinity of the atom flux
$D_o$ is the host atom self diffusion constant port due to electromigration in a conductor. This mechanism takes place principally in intergranular material and hence, the non-crystalline or amorphous diffusion activation energy is most pertinent.

Typical values for poly-crystalline films show $E_A \simeq 0.5$eV for metal film conductors. However, it is known that inclusions of small amounts of impurity atoms in the grain boundaries will modify this parameter. Moreover, this parameter is a function of the differences in atomic volumes and masses of the impurity relative to the host atom. For example, a relatively heavy impurity atom with a relatively large atomic volume will lead to an increase in $E_A$. However, for high conductivity purposes it is desirable to keep the crystalline portions of the poly-crystalline film as pure as possible. Therefore, the candidate impurity atom should have a low solubility at operating temperatures in the host material. In addition to all these considerations, the candidate impurity should be a material which can be easily deposited in thin film form with the host material, for example evaporation from a relatively stable alloy source, or sputter deposition from a solid alloy target. (For typical evaporation techniques, the vapor pressures of the two components should be relatively close at the source evaporation temperature.)

Table 1 comprises a listing of several elements which were considered in forming the alloy described herein.

TABLE 1

| Element Name | Resistivity ($10^{-6}\Omega$-cm) | Relative Atomic Volume | Atomic Mass(AMU) | Vapor Pressure 1000° C. ($10^{-3}$ TORR) | 1500° C. | Candidate |
|---|---|---|---|---|---|---|
| Ag | 1.6 | 10.3 | 108 | 6 | $7 \times 10^3$ | — |
| Cd | | 13.0 | 112 | | | No |
| In | | 15.3 | 115 | 30 | $1.5 \times 10^4$ | Yes |
| Sn | | 16.2 | 119 | 0.2 | $2 \times 10^2$ | Yes |
| Mo | 5.2 | 9.4 | 96 | | | No |
| W | 5.5 | 9.5 | 184 | | | No |
| Ta | | 10.9 | 181 | | | No |
| Re | | 9.3 | 186 | | | No |
| Pt | | 9.1 | 195 | | | No |
| Au | 2.2 | 10.2 | 197 | | | No |
| Pb | | 18.3 | 207 | $10^3$ | $2 \times 10^5$ | Yes |
| Al | 2.7 | 2.7 | 27 | | | No |
| Cu | 1.7 | 7.1 | 63 | 0.06 | $3 \times 10^2$ | Yes |
| Pd | | 8.9 | 106 | 0.002 | 20 | Yes |
| Be | | 5.0 | 9 | 0.2 | $5 \times 10^2$ | Yes |
| Mn | | 7.4 | 55 | 30 | $1.5 \times 10^4$ | Yes |
| Bi | | 21.3 | 209 | 4000 | $4 \times 10^5$ | Yes |
| Cr | | 7.2 | 52 | 0.002 | 50 | Yes |

By considering that D/kT is the atomic mobility at T, equation (2) can be expressed in a more familiar form as:

$$\hat{Q} = (N\mu q^*) \hat{E} \qquad (3)$$

(Thus it can be noted that $N\mu q^*$ can be analogized as atomic conductivity.)

By reducing the magnitude of Q, or specifically $\mu$, inasmuch as N, q and $\hat{E}$ are essentially constant for all practical purposes, electromigration can be reduced. Clearly, $\mu$ is a dynamic function of $D_o$, $E_A$ and T. The temperature is essentially a constant because of high current density application. Hence, the conductor temperature in a given operating ambient at a given current density can be varied only by small amounts. Hence, the self-diffusion constant and the activation energy of diffusion are the only two variables which can be modified. Working with high conductivity materials requires a high degree of material purity. Hence, $D_o$ is, essentially, invariable also. This leaves only the activation energy $E_A$, as a candidate for modifying the mass trans- The elements for which resistivity is not listed exhibit too high resistivity to be useful as conductors. Obviously, therefore, silver (Ag) has the best conductivity of the group and is the most desirable candidate as the host material. Copper is less desirable for other reasons. When the atomic mass and atomic volume of the elements is compared with Ag, several candidate dopant elements are defined. These elements are denoted by a "yes" in the candidate column. Also shown are the vapor pressures of the candidate elements at 1000° and 1500°, a range which spans the typical evaporation source temperatures.

Table 2 lists these elements and the solid solubility thereof in crystalline silver at approximately 300° C.

Table 2

| Element | Solubility (at %) @ 300° C. | Comments |
| --- | --- | --- |
| Indium (In) | 19 | Feasible-V.P. Match, High Solubility |
| Tin (Sn) | 10 | Feasible, Low V.P., High Solubility |
| Lead (Pb) | 1.5 | Eutectic Temp. Too Low (Not feasible at high substrate temperatures) |
| Copper (Cu) | ~1 | Feasible, Low V.P. |
| Palladium (Pd) | Full Miscibility | Not feasible |
| Beryllium (Be) | ~0 | Feasible-Low V.P. |
| Manganese (Mn) | 14 | Feasible-Hi Solubility, V.P. Match |
| Bismuth (Bi) | 2 | Feasible-Hi V.P. |
| Chromium (Cr) | ~0 | Feasible-Low V.P. |

Table 2 distills the candidates down to In, Mn, Bi, and Cr for evaporation processes. All the Elements listed in Table 2 (with the exception of Pd) are good candidates when sputtering is employed (especially Pb, Cu, Be, Bi, and Cr).

Furthermore, doped silver has a very high ion milling rate compared to most metals. For example, the ion milling rate of silver is approximately 4 to 5 times as great as the ion milling rate of aluminum. Thus, this particular feature or characteristic permits dry process etching through a photoresist pattern of a conductor without the attendant disadvantages of forming a photoresist film which is difficult to remove after the processing is completed. This advantage is specifically due to the high milling rate of the silver which results in a lower surface temperature on the wafer and, hence, less temperature hardening of the photoresist pattern. This particular aspect is, of course, highly desirable and advantageous in any fine-line lithographic process. Such fine-line lithography processes and techniques are widely used or proposed in magnetic bubble domain as well as VLSI (very large scale integrated) circuit techniques.

In Table 3, hereinafter, a general comparison is made between aluminum or copper doped aluminum versus a doped silver metal conductor. In particular, Table 3 refers to an alloy with 3% (at.) Indium with a silver host metal. However, dopants of 1% to 6% (atomic) have been found satisfactory depending upon the dopant and the specific parameter involved. Furthermore, if lower conductivity is acceptable, the dopant can reach 20%-25% (atomic) although these higher percentages are not as likely to be useful. The comparison is based upon several standard properties. It is clear that the silver exhibits lower resistivity and can be deposited or etched at least as easily as aluminum or copper doped aluminum. Moreover, optical reflectivity, thermal conductivity and electromigration rate are significantly improved in the case of the silver-based conductor.

TABLE 3

Bubble Device Technology Metal Conductor Options

| Al or Al (Cu ≅ 3%) | Property | Ag Doped |
| --- | --- | --- |
| 4-6 | Resistivity ($'\mu\Omega M$) | 2.0-3 |
| E-Beam | Deposition | E-Beam Evaporate or Sputter |
| Chemical (Difficult to Achieve Vertical Walls) | Etch Techniques | Ion Mill (Very High Rate) Easy to Achieve Vertical Walls |
| Very Good | Adhesion to Substrate Surface | Fair to Very Good |
| Fair to Good | Bondability | Very Good |
| Poor Above $10^7 A/cm^2$ | Electromigration Resistance | Apparently Good Compared to Al/Cu or Al |
| ~70 Percent | Optical Reflectivity | ~95 Percent |
| 0.49 | Thermal Conductivity Cal/cm/°C. @ 100° C. | 0.97 |

Thus, there has been described a preferred embodiment of the instant invention. The preferred embodiment uses silver as a base or host material with a doping material added thereto to improve various attributes of the silver. These dopants permit the silver conductor to function in a more desirable manner. The silver conductor is, therefore, highly advantageous in many specific devices such as magnetic bubble domain devices and the like. It is clear that certain other dopant materials can be used above and beyond the several materials suggested. However, those skilled in the art may, in response to this teaching, experiment to find additional dopant type materials. Such dopants are intended to be included in this description as well.

Having thus described a preferred embodiment of the instant invention, what is claimed is:

1. A high conductivity, low migration rate metallic alloy for use in magnetic bubble domain structures comprising a host material of silver, and a dopant comprising 1% to 6% (atomic) and taken from the class comprising In, Mn, Bi, Cr, Pb, Cu, Be.

2. The alloy recited in claim 1 wherein the upper limit of said dopant percentage approaches 25% but the conductivity of the alloy is diminished.

* * * * *